US007760541B2

(12) United States Patent
Adams et al.

(10) Patent No.: US 7,760,541 B2
(45) Date of Patent: Jul. 20, 2010

(54) FUNCTIONAL FLOAT MODE SCREEN TO TEST FOR LEAKAGE DEFECTS ON SRAM BITLINES

(75) Inventors: Chad A Adams, Byron, MN (US); Juergen Pille, Stuttgart (DE)

(73) Assignee: International Business Machines Corporation, Armonk, NY (US)

( * ) Notice: Subject to any disclaimer, the term of this patent is extended or adjusted under 35 U.S.C. 154(b) by 149 days.

(21) Appl. No.: 12/190,242

(22) Filed: Aug. 12, 2008

(65) Prior Publication Data

US 2010/0039876 A1 Feb. 18, 2010

(51) Int. Cl.
*G11C 11/00* (2006.01)

(52) U.S. Cl. ...................................... 365/154; 365/203

(58) Field of Classification Search .................. 365/154, 365/156, 201, 202, 203
See application file for complete search history.

(56) References Cited

U.S. PATENT DOCUMENTS 7,120,076 B2 * 10/2006 Sugahara .................... 365/222
7,512,030 B2 * 3/2009 Houston et al. ............. 365/226
2003/0157764 A1 * 8/2003 Ahn et al. ................... 438/212
2009/0147603 A1 * 6/2009 Houston et al. ............. 365/203

* cited by examiner

*Primary Examiner*—Gene N. Auduong
(74) *Attorney, Agent, or Firm*—Dillon & Yudell LLP.

(57) ABSTRACT

A method and system for maintaining Static Random Access Memory (SRAM) functionality while simultaneously screening for leakage paths from bitline to ground during Float Mode operation. The SRAM configuration enables SRAM cell selection for a read or write operation. In response to the SRAM cell selection, a group of pre-charge (PCHG) signals are provided with a high value. When selection is made from a top sub-group of SRAM cells, a corresponding bitline, "BLT_TOP", takes a value which reflects a state stored in the selected cell. In addition, the bitline corresponding to the bottom sub-group of cells, "BLT_BOT", takes a high value. If there is a leakage defect, BLT_BOT drops to a low value. With no leakage defect, the data stored in the selected cell is determined based on the result of a logical NAND operation including the respective states indicated by the BLT_TOP and by the BLT_BOT.

8 Claims, 5 Drawing Sheets

FUNCTIONAL FLOAT MODE SCREEN TO TEST FOR LEAKAGE DEFECTS ON SRAM BITLINES

BACKGROUND

1. Technical Field

The present invention generally relates to electronic memory systems and in particular to leakage detection in electronic memory systems.

2. Description of the Related Art

A conventional domino SRAM configuration occasionally experiences parasitic leakage defects. While existing solutions allow for detection of leakage paths from the bitline to ground, the solution does not maintain the original function of the SRAM. This inability to maintain the original function adds to test complexity and leads to difficulties in isolating the failing domino local bitline for failure analysis.

SUMMARY OF ILLUSTRATIVE EMBODIMENTS

Disclosed are a method and system for maintaining Static Random Access Memory (SRAM) functionality while simultaneously screening for leakage paths from bitline to ground during Float Mode operation. The SRAM configuration enables SRAM cell selection for a read or write operation. In response to the SRAM cell selection, a group of pre-charge (PCHG) signals are provided with a high value. When selection is made from a top sub-group of SRAM cells, a corresponding bitline, "BLT_TOP", takes a value which reflects a state stored in the selected cell. In addition, the bitline corresponding to the bottom sub-group of cells, "BLT_BOT", takes a high value. If there is a leakage defect, BLT_BOT drops to a low value. With no leakage defect, the data stored in the selected cell is determined based on the result of a logical NAND operation including the respective states indicated by the BLT_TOP and by the BLT_BOT.

The above as well as additional objectives, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

Figure 1:
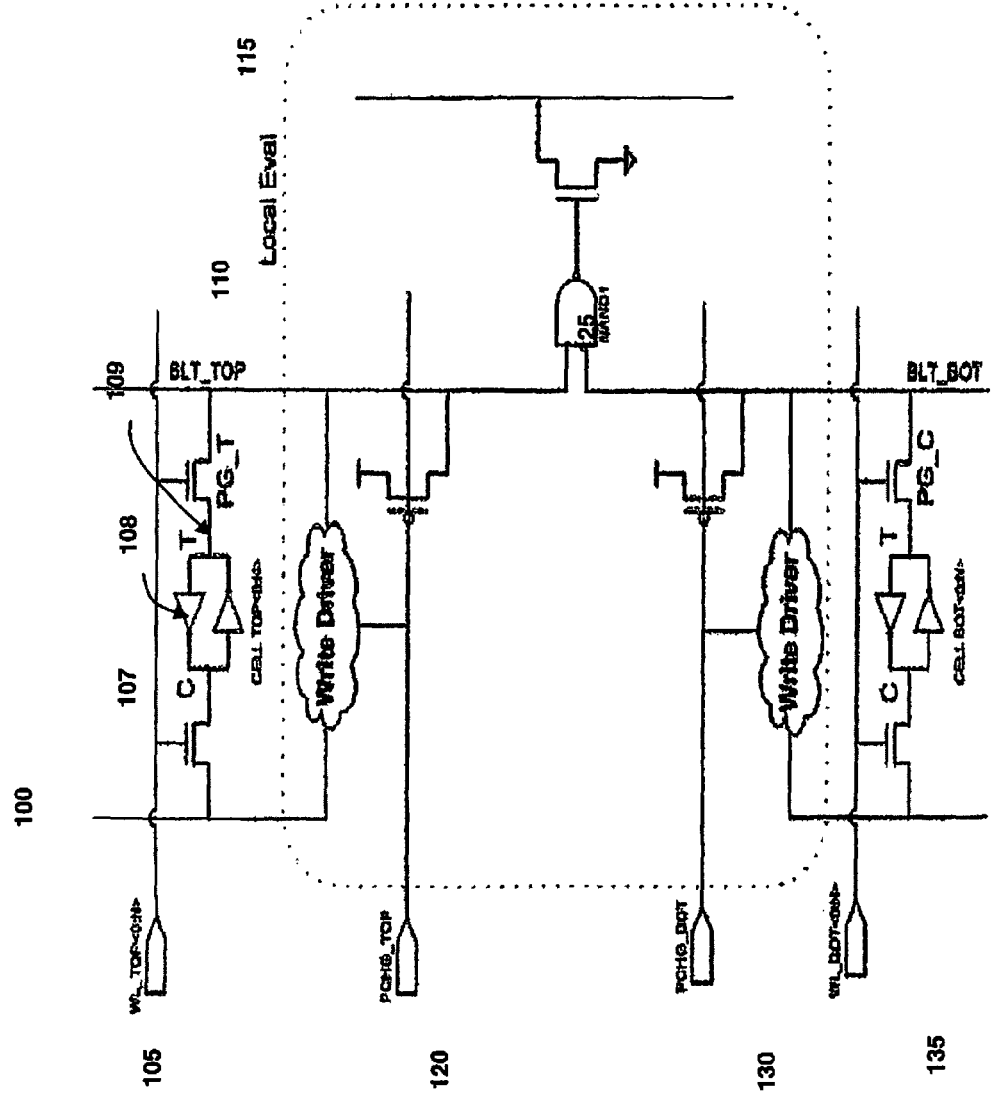
FIG. 1 illustrates a conventional domino SRAM configuration, according to the prior art.

The illustrative embodiments provide a method and system for maintaining Static Random Access Memory (SRAM) functionality while simultaneously screening for leakage paths from bitline to ground during Float Mode operation. The SRAM configuration enables SRAM cell selection for a read or write operation. In response to the SRAM cell selection, a group of pre-charge (PCHG) signals are provided with a high value. When selection is made from a top sub-group of SRAM cells, a corresponding bitline, "BLT_TOP", takes a value which reflects a state stored in the selected cell. In addition, the bitline corresponding to the bottom sub-group of cells, "BLT_BOT", takes a high value. If there is a leakage defect, BLT_BOT drops to a low value. With no leakage defect, the data stored in the selected cell is determined based on the result of a logical NAND operation including the respective states indicated by the BLT_TOP and by the BLT_BOT.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims.

Within the descriptions of the figures, similar elements are provided similar names and reference numerals as those of the previous figure(s). Where a later figure utilizes the element in a different context or with different functionality, the element is provided a different leading numeral representative of the figure number (e.g., 1xx for FIG. 1 and 2xx for FIG. 2). The specific numerals assigned to the elements are provided solely to aid in the description and not meant to imply any limitations (structural or functional) on the invention.

It is understood that the use of specific component, device and/or parameter names are for example only and not meant to imply any limitations on the invention. The invention may thus be implemented with different nomenclature/terminology utilized to describe the components/devices/parameters herein, without limitation.

Figure 2:
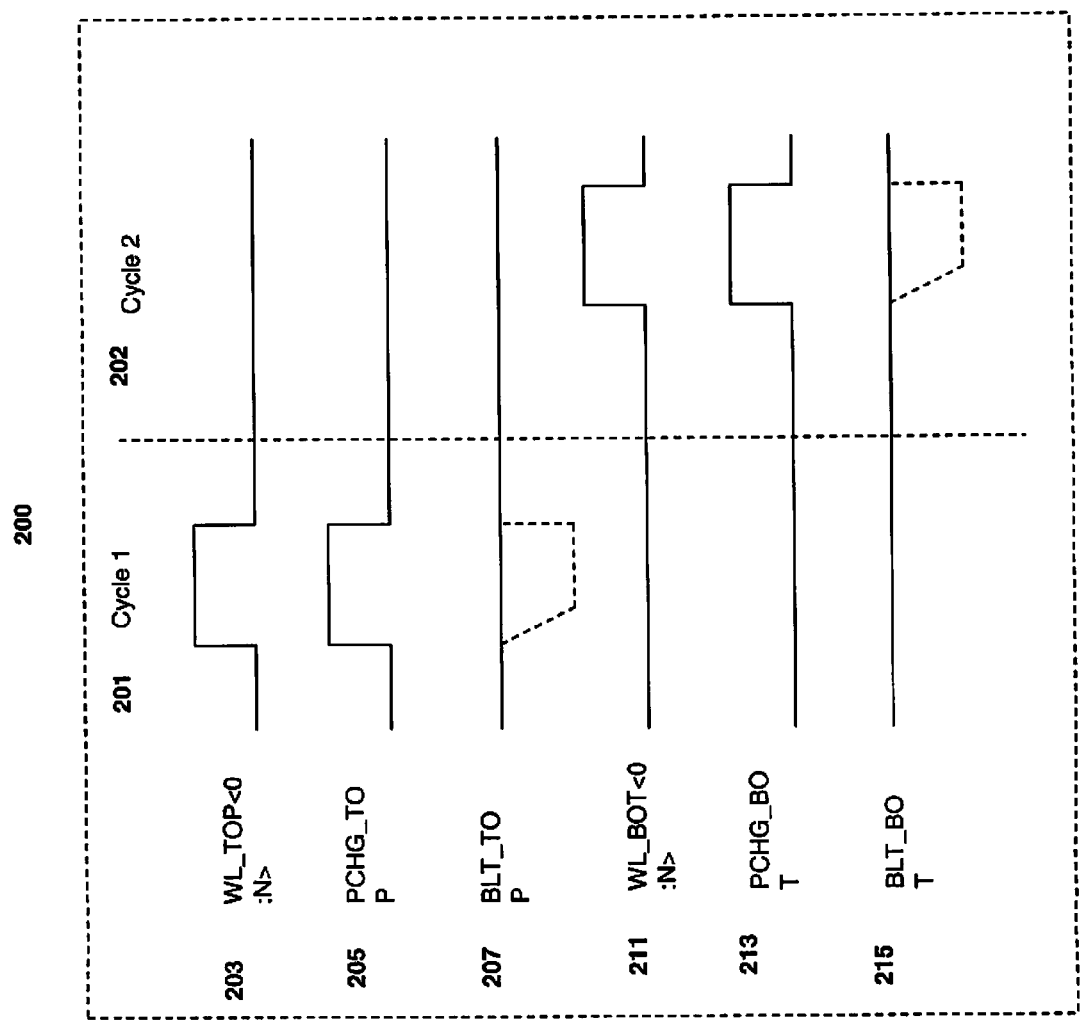
FIG. 2 shows a set of timing waveforms, according to the prior art.

FIG. 1 illustrates a conventional domino SRAM configuration, according to the prior art. In SRAM configuration 100, a group of SRAM cells (comprised of Cell_TOP<0:N> 107 and Cell_BOT<0:N> 137) is connected from the top and bottom of the "LOCAL EVAL" 115. "LOCAL EVAL" 115 is a continuous bitline local evaluation circuit designed to evaluate a group of SRAM cells in an array. Facilitating a description of the conventional domino SRAM configuration is FIG. 2 which shows the corresponding timing waveforms, according to the prior art. The function of the domino SRAM is described as follows.

During normal operation, the WL and PCHG signals switch in pairs such that when a cell in the top group (Cell_TOP<0:N> 107), for example, of SRAM cells is selected by WL_TOP<0:N> 105 as illustrated by timing waveform WL_TOP<0:N> 103 in cycle 1 201, PCHG_TOP 120 is selected (i.e., taken high). The corresponding timing waveform is illustrated by waveform PCHG_TOP 205. On the other hand, PCHG_BOT 130 is held low and BLT_BOT 140 is held high. The corresponding timing waveforms are illustrated by waveform PCHG_BOT 213 and waveform BLT_BOT 215, respectively.

In response, the state of BLT_TOP 110 is dependent on the state stored in the SRAM cell (within Cell_TOP<0:N> 107). If node T 108 has a zero stored, BLT_TOP 110 discharges (i.e., reads a zero), whereas if node T 108 has a 1 stored BLT_TOP 110 remains high (i.e., reads a 1).

The read of a "1" in normal operation presents a testability issue involving leakage defects. Since passgate PG_T 109 is a NFET, the BLT_TOP node may leak down to a value which is approximately equal to voltage of the selected cell minus the NFET threshold voltage (Vt) (i.e., Cell Voltage–Vt of NFET) before PG_T 109 starts to conduct (to provide the functions of a weak keeper). Therefore the BLT_TOP node may drift down close to the switch point of NAND1 125, leaving the circuit sensitive to environmental changes (i.e., voltage, temperature, noise, etc.). In addition, cases in which a small leakage path to ground existed when the path was new inevitably worsen over time. Cycle 2 102 shows the converse of the above occurs when the bottom group of SRAM cells is accessed via WL_BOT<0:N> 135.

Figure 3:
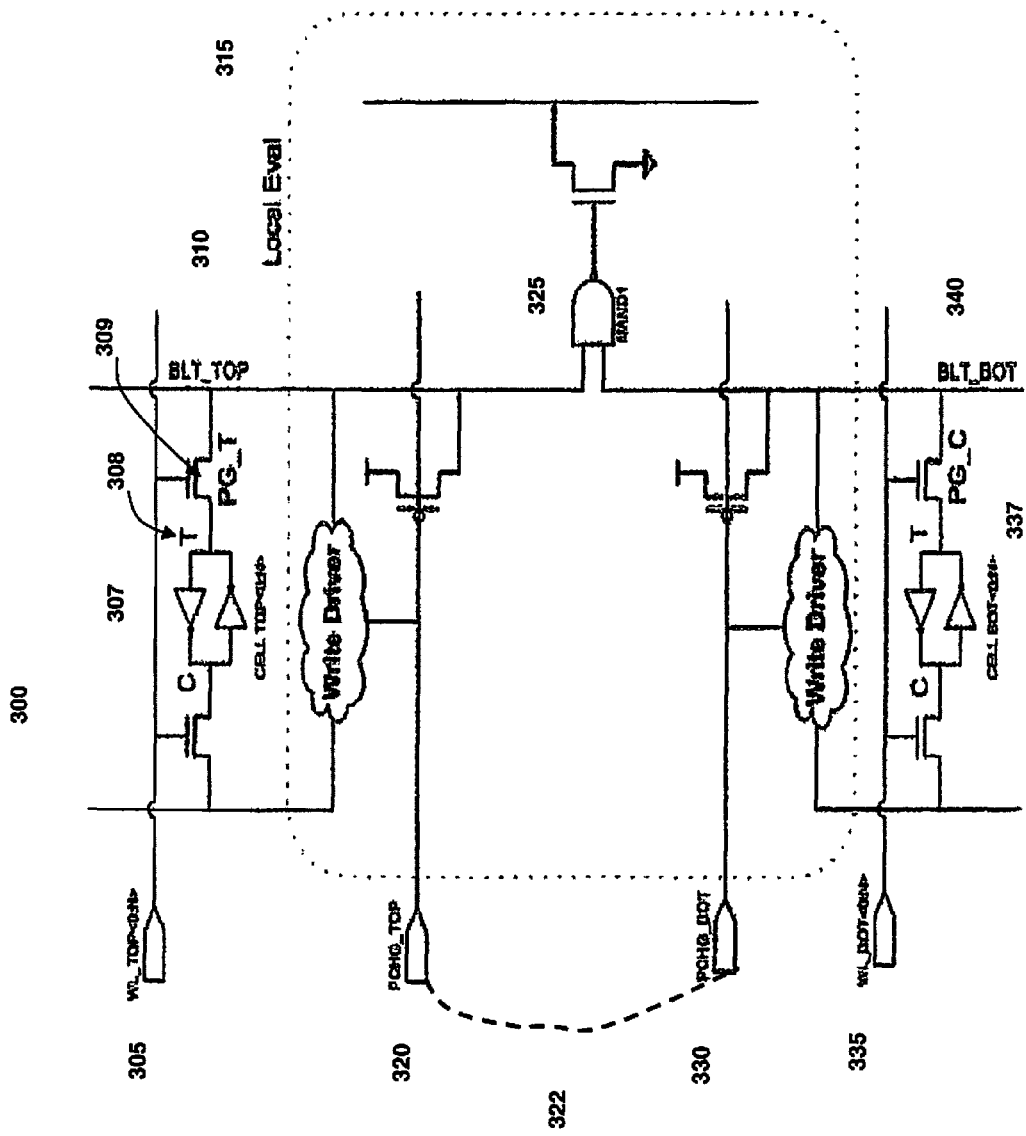
FIG. 3 illustrates a domino SRAM configuration, according to one embodiment.

With reference to the figures, FIG. 3 illustrates a domino SRAM configuration where a group of SRAM cells, according to one embodiment. Among the functionality provided by SRAM configuration 300, and which are specific to the invention, are: (a) logic for enabling an SRAM cell selection for a read or write operation; (b) logic for detecting a leakage current defect resulting from a leakage path from a bitline to ground; and (c) logic for determining a value of the data stored in the selected cell. According to the illustrative embodiment, SRAM configuration 300 initiates a series of functional processes that enable the above functional features as well as additional features/functionality, which are described below within the description of FIGS. 4-5.

Those of ordinary skill in the art will appreciate that the hardware and basic configuration depicted in FIG. 3 may vary. For example, other devices/components may be used in addition to or in place of the hardware depicted. The depicted example is not meant to imply architectural limitations with respect to the present invention.

Figure 4:
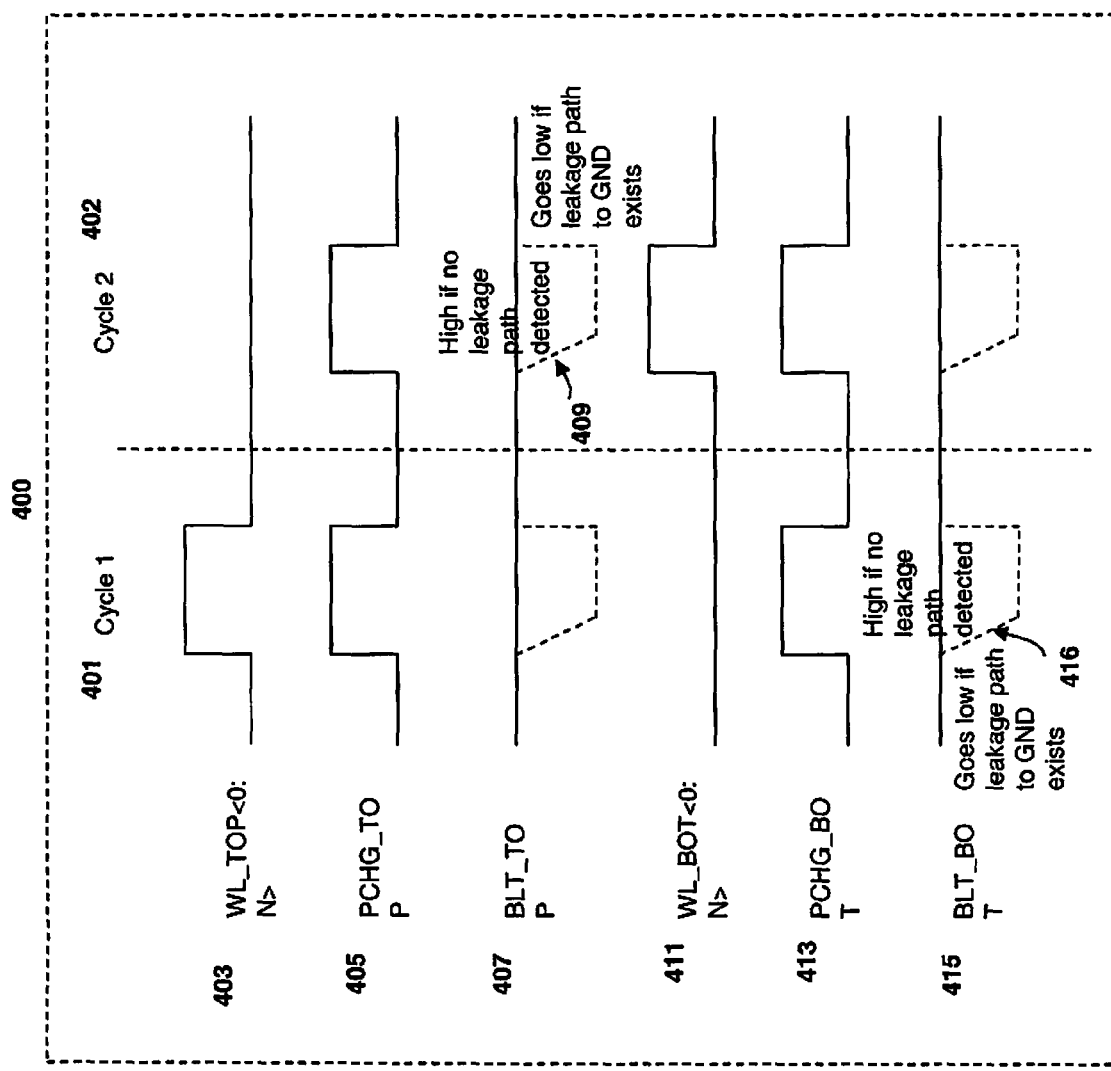
FIG. 4 illustrates a set of timing waveforms, according to one embodiment.

FIG. 3 illustrates a domino SRAM configuration where a group of SRAM cells (comprised of Cell_TOP<0:N> 307 and Cell_BOT<0:N> 337) is connected from the top and bottom of the "LOCAL EVAL" 315. FIG. 4 shows the corresponding timing waveforms, according to one embodiment. The function of the domino SRAM is described as follows.

During Float Mode operation, the WL and PCHG signals all switch together such that when a cell in the top group (Cell_TOP<0:N> 307) of SRAM cells is selected by WL_TOP<0:N> 305 as illustrated by timing waveform WL_TOP<0:N> 403 in cycle 1 401, both PCHG_TOP 320 and PCHG_BOT 330 are selected (i.e., taken high). PCHG_TOP 320 and PCHG_BOT 330 may be tied together by link 322 to enable the simultaneous selection of PCHG_TOP 320 and PCHG_BOT 330. In one embodiment, logic in the SRAM periphery may enable both PCHG signals to be selected when in this test mode/Float Mode. The corresponding timing waveforms are illustrated by PCHG_TOP 405 and PCHG_BOT 413, respectively. Consequently, BLT_BOT 340 is left with an expected high/floating value since no selection of a cell is made via WL_BOT<0:N> 335 as shown by the low value maintained by waveform WL_BOT<0:N> 411 in Cycle 1 401. In response, the state of BLT_TOP 310 is dependent on the state stored in the SRAM cell (within Cell_TOP<0:N> 307). If node T 308 has a zero stored, BLT_TOP 310 discharges (i.e., reads a zero), whereas if node T 308 has a 1 stored BLT_TOP 310 remains high (i.e., reads a 1). The read of a 1 in normal operation is where an ability to detect leakage defects provides a particular advantage. This ability to detect leakage defects is provided during Float Mode operation. In addition, during Float Mode operation, the read of a "1" (in the absence of a defect) occurs with identical SRAM functionality to the functionality of the SRAM cell during normal mode of operation.

If there is a parasitic leakage path to ground, BLT_BOT 340 leaks down (i.e., drops to a low value) as shown by BLT_BOT-leakage 416 in Cycle 1 401. The voltage leakage causes an override of the data on BLT_TOP 310.

Cycle 2 402 shows the converse of the above occurs when the bottom group of SRAM cells is accessed via WL_BOT<0:N> 335. In Cycle 2 402, the defect is detected in BLT_TOP N> 335. In Cycle 2 402, the defect is detected in BLT_TOP BLT_TOP 310 as illustrated in waveform 400 by BLT_TOP-leakage 409.

If there is no parasitic leakage paths to ground, BLT_BOT maintains the high value and since BLT_TOP and BLT_BOT are NANDED together the SRAM reads the correct data determined by the cell selected by WL_TOP(X). Thus, the SRAM functions as normal. However, if there is a parasitic leakage path to ground, BLT_BOT leaks down (i.e., drops to a low value) and overrides the data on BLT_TOP. The converse is illustrated in Cycle 2 where a defect is detected in BLT_TOP. If a leakage failure does occur, the failing bitline may be isolated and is identified as the opposite bitline selected by the WL.

The ability to isolate the failing bitline for failure analysis is added without any change to existing Array Built In Self Test (ABIST) engines. Since the function of the SRAM (during Float Mode operation) in the absence of a defect is identical to the SRAM function in the normal mode of operation, this ability/functionality (to isolate failures) may be used while the chip is executing instructions as a screen if there are environmental differences (i.e., voltage, temperature, noise, etc.) between ABIST and normal chip function.

Figure 5:
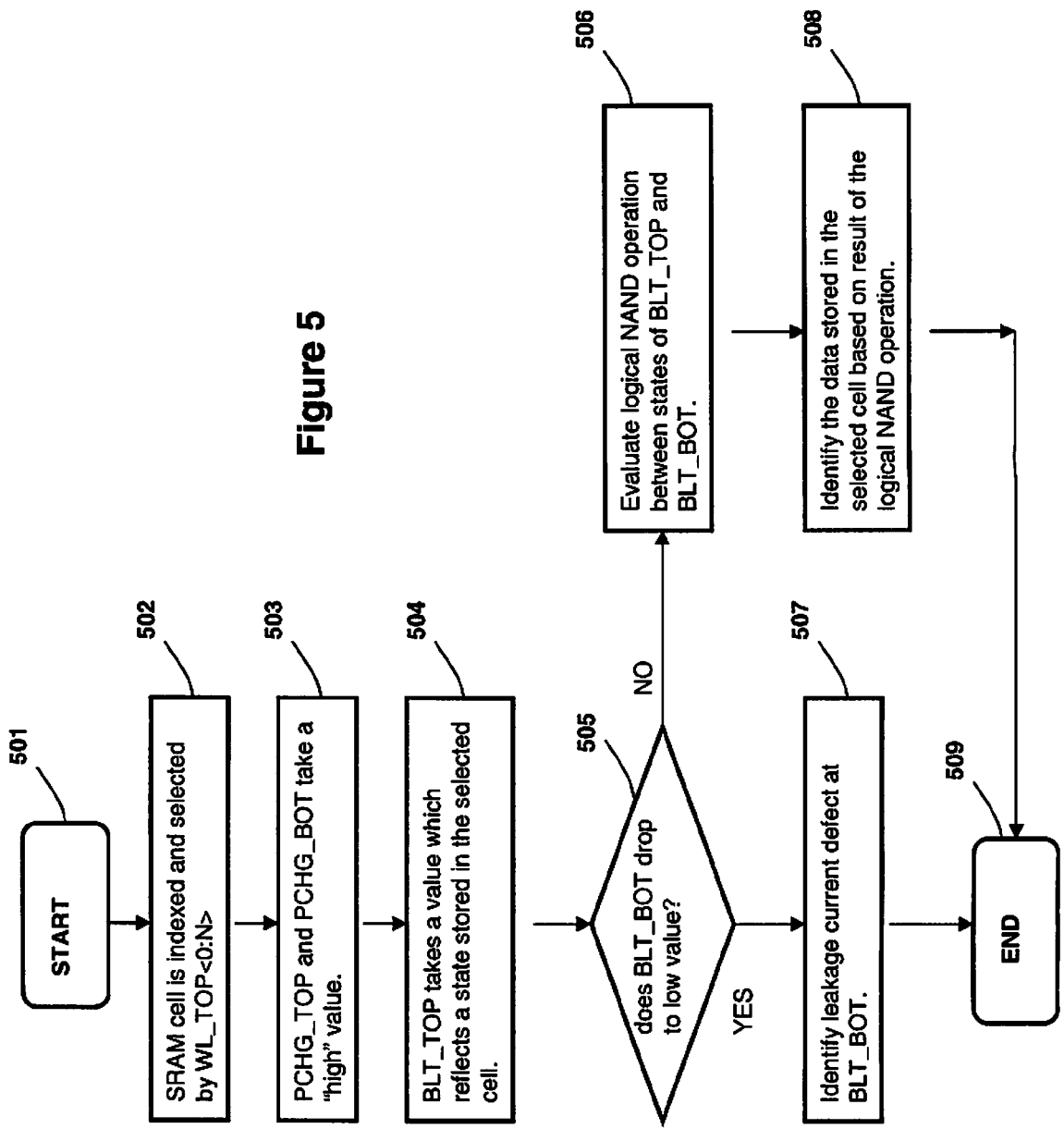
FIG. 5 is a flow chart illustrating the process of screening for leakage path defects while maintaining SRAM functionality, according to one embodiment.

FIG. 5 is a flow chart illustrating a method by which the above processes of the illustrative embodiments are completed. Although the methods illustrated in FIG. 5 may be described with reference to components shown in FIGS. 1-4, it should be understood that this is merely for convenience and alternative components and/or configurations thereof can be employed when implementing the various methods.

The process of FIG. 5 begins at initiator block 501 and proceeds to block 502, at which an SRAM cell, during Float Mode operation, is indexed and selected by WL_TOP<0:N>. At block 503, PCHG_TOP and PCHG_BOT take a "high" value. BLT_TOP takes a value which reflects a state stored in the selected cell, as shown at block 504. At decision block 505, the SRAM configuration determines whether BLT_BOT has dropped to low value. If at block 505, the SRAM configuration determines that BLT_BOT has dropped to low value, the process proceeds to block 507, at which leakage current defect is identified at BLT_BOT. If at block 505, the SRAM configuration determines that BLT_BOT has not dropped to low value, the process proceeds to block 506, at which a logical NAND operation between states of BLT_TOP and BLT_BOT is evaluated. At block 508, the data stored in the selected cell and based on result of the logical NAND operation is identified. The process ends at block 509.

In the flow charts above, one or more of the methods are embodied as a series of steps. In some implementations, certain steps of the methods are combined, performed simultaneously or in a different order, or perhaps omitted, without deviating from the spirit and scope of the invention. Thus, while the method steps are described and illustrated in a particular sequence, use of a specific sequence of steps is not meant to imply any limitations on the invention. Changes may be made with regards to the sequence of steps without departing from the spirit or scope of the present invention. Use of a particular sequence is therefore, not to be taken in a limiting sense, and the scope of the present invention is defined only by the appended claims.

As will be further appreciated, the processes in embodiments of the present invention may be implemented using any combination of software, firmware or hardware. As a preparatory step to practicing the invention in software, the programming code (whether software or firmware) will typically be stored in one or more machine readable storage mediums such as fixed (hard) drives, diskettes, optical disks, magnetic tape, semiconductor memories such as ROMs, PROMs, etc., thereby making an article of manufacture (or computer program product) in accordance with the invention. The article of manufacture containing the programming code is used by either executing the code directly from the storage device, by copying the code from the storage device into another storage device such as a hard disk, RAM, etc., or by transmitting the code for remote execution using transmission type media such as digital and analog communication links. The methods of the invention may be practiced by combining one or more machine-readable storage devices containing the code according to the present invention with appropriate processing hardware to execute the code contained therein. An apparatus for practicing the invention could be one or more processing devices and storage systems containing or having network access to program(s) coded in accordance with the invention.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. In an Static Random Access Memory (SRAM) configuration, a method comprising:
   initiating a Float Mode operation of the SRAM configuration;
   selecting, during a first cycle, a first cell from a first plurality of SRAM cells indexed via WL_TOP<0:N> or a second cell from a second plurality of SRAM cells indexed via WL_BOT<0:N>;
   in response to a selection of the first cell or the second cell, providing a corresponding PCHG_TOP and a corresponding PCHG_BOT with a high value;
   detecting a leakage defect as a result of a leakage path from a domino bitline to ground; and
   determining a value of the data stored in the selected cell.

2. The method of claim 1, wherein said providing further comprises:
   in response to the first cell selection via WL_TOP<0:N> and placement of the PCHG_TOP and the PCHG_BOT to a high value, executing the following including: (1) providing BLT_BOT with an expected high value; (2) providing BLT_TOP with a value which reflects a state stored in the selected cell; and (3) dropping a value of BLT_BOT to a low value or maintaining the expected high value at BLT_BOT; and
   in response to the second cell selection by WL_BOT<0:N> and placement of the PCHG_TOP and the PCHG_BOT to a high value, executing the following including: (1) providing BLT_TOP with an expected high value; (2) providing BLT_BOT with a value which reflects a state stored in the selected cell; and (3) dropping a value of BLT_TOP to a low value or maintaining the expected high value at BLT_TOP.

3. The method of claim 1, wherein said detecting further comprises:
   when a cell indexed by WL_BOT<0:N> is selected in the first cycle and BLT_TOP drops to a low value instead of a maintenance of the expected high value, identifying a leakage current defect at BLT_TOP; and
   when a cell indexed by WL_TOP<0:N> is selected in the first cycle and BLT_BOT drops to a low value instead of a maintenance of the expected high value, providing an identification of a leakage current defect at BLT_BOT.

4. The method of claim 1, wherein said determining further comprises:
   evaluating a result of a logical NAND operation performed between a first state indicated by the BLT_TOP and a second state indicated by the BLT_BOT; and
   in response to the maintenance of the expected high value, identifying the data stored in the selected cell based on the value of the result of the logical NAND operation.

5. A system comprising:
   a SRAM configuration;
   functions for initiating a Float Mode operation of the SRAM configuration;
   functions for selecting, during a first cycle, a first cell from a first plurality of SRAM cells indexed via WL_TOP<0:N> or a second cell from a second plurality of SRAM cells indexed via WL_BOT<0:N>;
   in response to a selection of the first cell or the second cell, functions for providing a corresponding PCHG_TOP and a corresponding PCHG_BOT with a high value;
   functions for detecting a leakage defect as a result of a leakage path from a domino bitline to ground; and
   functions for determining a value of the data stored in the selected cell.

6. The system of claim 5, wherein said functions for providing further comprises functions for:
   in response to the first cell selection via WL_TOP<0:N> and placement of the PCHG_TOP and the PCHG_BOT to a high value, executing the following including: (1) providing BLT_BOT with an expected high value; (2) providing BLT_TOP with a value which reflects a state stored in the selected cell; and (3) dropping a value of BLT_BOT to a low value or maintaining the expected high value at BLT_BOT; and
   in response to the second cell selection by WL_BOT<0:N> and placement of the PCHG_TOP and the PCHG_BOT to a high value, executing the following including: (1) providing BLT_TOP with an expected high value; (2) providing BLT_BOT with a value which reflects a state stored in the selected cell; and (3) dropping a value of BLT_TOP to a low value or maintaining the expected high value at BLT_TOP.

7. The system of claim 5, wherein said functions for detecting further comprises functions for:
   when a cell indexed by WL_BOT<0:N> is selected in the first cycle and BLT_TOP drops to a low value instead of a maintenance of the expected high value, identifying a leakage current defect at BLT_TOP; and
   when a cell indexed by WL_TOP<0:N> is selected in the first cycle and BLT_BOT drops to a low value instead of a maintenance of the expected high value, providing an identification of a leakage current defect at BLT_BOT.

8. The system of claim 5, wherein said functions for determining further comprises functions for:
  evaluating a result of a logical NAND operation performed between a first state indicated by the BLT_TOP and a second state indicated by the BLT_BOT; and
  in response to the maintenance of the expected high value, identifying the data stored in the selected cell based on the value of the result of the logical NAND operation.

* * * * *